United States Patent
Fujii

(10) Patent No.: US 10,027,292 B1
(45) Date of Patent: Jul. 17, 2018

(54) COMPACT DUAL DIODE RF POWER DETECTOR FOR INTEGRATED POWER AMPLIFIERS

(71) Applicant: MACOM Technology Solutions Holdings, Inc., Lowell, MA (US)

(72) Inventor: Kohei Fujii, San Jose, CA (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 33 days.

(21) Appl. No.: 15/153,988

(22) Filed: May 13, 2016

(51) Int. Cl.
| | |
|---|---|
| H01P 5/18 | (2006.01) |
| H01P 3/08 | (2006.01) |
| H03F 3/195 | (2006.01) |
| H03F 3/213 | (2006.01) |
| H01L 23/66 | (2006.01) |
| H03F 1/30 | (2006.01) |
| H03F 1/56 | (2006.01) |
| G01R 31/28 | (2006.01) |
| G01R 21/00 | (2006.01) |

(52) U.S. Cl.
CPC .......... *H03F 3/195* (2013.01); *G01R 21/00* (2013.01); *G01R 31/2822* (2013.01); *H01L 23/66* (2013.01); *H03F 1/30* (2013.01); *H03F 1/56* (2013.01); *H03F 3/213* (2013.01); *H01L 2223/6627* (2013.01); *H01L 2223/6683* (2013.01); *H03F 2200/255* (2013.01); *H03F 2200/447* (2013.01); *H03F 2200/451* (2013.01); *H03F 2200/465* (2013.01)

(58) Field of Classification Search
CPC H01P 5/18; H01P 5/184; G01R 21/00; G01R 31/2822; H01L 23/66
USPC ................................................. 333/109, 116
See application file for complete search history.

(56) References Cited

U.S. PATENT DOCUMENTS

| | | | | | |
|---|---|---|---|---|---|
| 3,863,024 | A | * | 1/1975 | Caragliano | ....... H04L 25/03127 333/109 |
| 3,979,699 | A | * | 9/1976 | Caragliano | ............. H01P 5/182 333/116 |
| 4,122,400 | A | * | 10/1978 | Medendorp | ............... H03F 1/52 330/207 P |

(Continued)

FOREIGN PATENT DOCUMENTS

WO   WO 2013/152786 A1   10/2013   ............. G01R 21/01

OTHER PUBLICATIONS

Harty, Daniel D., "Novel Design of a Wideband Ribcage-Dipole Array and its Feeding Network", Worcester Polytechnic Institute, Dec. 17, 2010, 106 pages.

(Continued)

*Primary Examiner* — Dean Takaoka
(74) *Attorney, Agent, or Firm* — Thomas | Horstemeyer, LLP; Michael J. D'Aurelio; Jason M. Perilla

(57) ABSTRACT

An apparatus includes a first directional coupler, a second directional coupler, a first detector, and a second detector. A through port of the first directional coupler is coupled to a through port of the second directional coupler. An isolated port of the first directional coupler is coupled to an isolated port of the second directional coupler. A coupled port of the first directional coupler is coupled to the first detector. A coupled port of the second directional coupler is coupled to the second detector. A detected power signal is generated by combining an output of the first detector and an output of the second detector.

20 Claims, 7 Drawing Sheets

(56) References Cited

U.S. PATENT DOCUMENTS

| | | | | |
|---|---|---|---|---|
| 4,190,815 | A * | 2/1980 | Albanese | H01P 1/12 333/101 |
| 5,038,112 | A * | 8/1991 | O'Neill | H03G 3/3047 330/207 P |
| 5,126,686 | A * | 6/1992 | Tam | H03G 3/001 330/134 |
| 6,603,960 | B1 * | 8/2003 | Oida | H01P 5/185 455/115.3 |
| 7,339,366 | B2 | 3/2008 | Li et al. | 324/95 |
| 7,379,714 | B2 * | 5/2008 | Haque | H03F 1/0261 343/860 |
| 7,414,493 | B1 * | 8/2008 | Hussain | H01P 5/185 333/109 |
| 7,440,731 | B2 * | 10/2008 | Staudinger | H03F 1/0205 455/126 |
| 8,536,956 | B2 * | 9/2013 | Tamaru | H01P 5/184 333/112 |
| 8,606,198 | B1 * | 12/2013 | Wright | H01P 5/18 333/109 |
| 8,649,744 | B2 * | 2/2014 | Acimovic | H03F 3/602 330/124 R |
| 8,942,658 | B2 * | 1/2015 | Banwell | H04B 1/58 343/852 |
| 2010/0286686 | A1 * | 11/2010 | Hancock | A61B 18/18 606/33 |
| 2014/0313088 | A1 * | 10/2014 | Rozenblit | H04B 1/0458 343/745 |
| 2014/0361953 | A1 * | 12/2014 | Spokoinyi | H01P 5/184 343/905 |
| 2016/0370458 | A1 * | 12/2016 | Wursthorn | H04B 17/11 |

OTHER PUBLICATIONS

Grebennikov, Andrei, "Power Combiners, Impedance Transformers and Directional Couplers", High Frequency Electronics, Dec. 2007, 12 pages.

Grebennikov, Andrei, "Power Combiners, Impedance Transformers and Directional Couplers: Part II", High Frequency Electronics, Jan. 2008, 7 pages.

Grebennikov, Andrei, "Power Combiners, Impedance Transformers and Directional Couplers: Part III", High Frequency Electronics, Feb. 2008 8 pages.

Grebennikov, Andrei, "Power Combiners, Impedance Transformers and Directional Couplers: Part IV", High Frequency Electronics, Mar. 2008, 4 pages.

* cited by examiner

US 10,027,292 B1

COMPACT DUAL DIODE RF POWER DETECTOR FOR INTEGRATED POWER AMPLIFIERS

FIELD OF THE INVENTION

The invention relates to power detection generally and, more particularly, to a method and/or apparatus for implementing a compact dual diode RF power detector for integrated power amplifiers.

BACKGROUND

In many microwave and millimeter (mm)-wave radio applications, power measurement is necessary. Conventional radio frequency (RF) power detectors include a directional coupler, a detector diode, and a termination resistor. The conventional power detector is integrated at the output RF port of a power amplifier on a monolithic microwave integrated circuit (MMIC). In this configuration, the conventional directional coupler based power detector needs an additional coupling line after a power combiner. The addition of the power detector and coupling line increases the circuit size and adds insertion loss. As a result, with the conventional technique, an increase in MMIC die size is an inevitable issue and additional cost cannot be avoided.

It would be desirable to implement a compact dual diode RF power detector for integrated power amplifiers.

SUMMARY

The invention concerns an apparatus including a first directional coupler, a second directional coupler, a first detector, and a second detector. A through port of the first directional coupler is coupled to a through port of the second directional coupler. An isolated port of the first directional coupler is coupled to an isolated port of the second directional coupler. A coupled port of the first directional coupler is coupled to the first detector. A coupled port of the second directional coupler is coupled to the second detector. A detected power signal is generated by combining an output of the first detector and an output of the second detector.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a compact dual diode RF power detector for integrated power amplifiers that may (i) be integrated within a power amplifier footprint, (ii) minimize an increase in the power amplifier footprint, (iii) be integrated without increasing a die size of the power amplifier, (iv) be integrated without increasing a cost of the power amplifier, (v) utilize a symmetrical detector structure, (vi) be integrated within an output power combiner/impedance transformer, (vii) be integrated without sacrificing power amplifier performance, and/or (viii) be implemented in a monolithic microwave integrated circuit.

Figure 1:
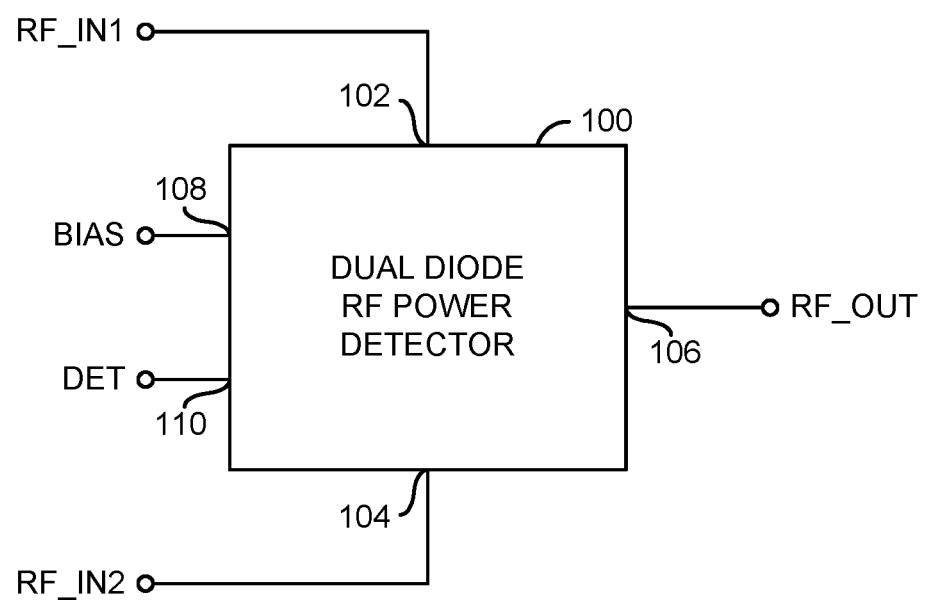
FIG. 1 is a block diagram illustrating a power detector in accordance with an example embodiment of the invention.

Referring to FIG. 1, a block diagram of a circuit 100 is shown illustrating a power detector in accordance with an example embodiment of the invention. The circuit 100 generally implements a compact dual diode radio frequency (RF) power detector in accordance with an example embodiment of the invention. In various embodiments, the circuit 100 has an input 102, an input 104, an output 106, an input 108, and an output 110. The input 102 generally implements a first RF input port. The input 104 generally implements a second RF input port. The output 106 generally implements an RF output port. The input 108 generally implements a bias signal (e.g., BIAS) input. The output 110 generally presents an RF power detection signal (e.g., DET).

In various embodiments, the circuit 100 may be configured to combine a first RF input signal (e.g., RF_IN1) presented at the RF input port 102 and a second RF input signal (e.g., RF_IN2) presented at the second RF input port 104 for presentation as an RF output signal (e.g., RF_OUT) at the RF output port 106. The RF power detection signal DET representing the combined power of the signals RF_IN1 and RF_IN2 is generally presented at the output 110. In various embodiments, the signal BIAS may be used to provide an optimal voltage level for generation of the power detection signal DET. The combined power is independent of load phase and is an accurate representation of the total power of the signal presented at the RF output port 106.

Figure 2:
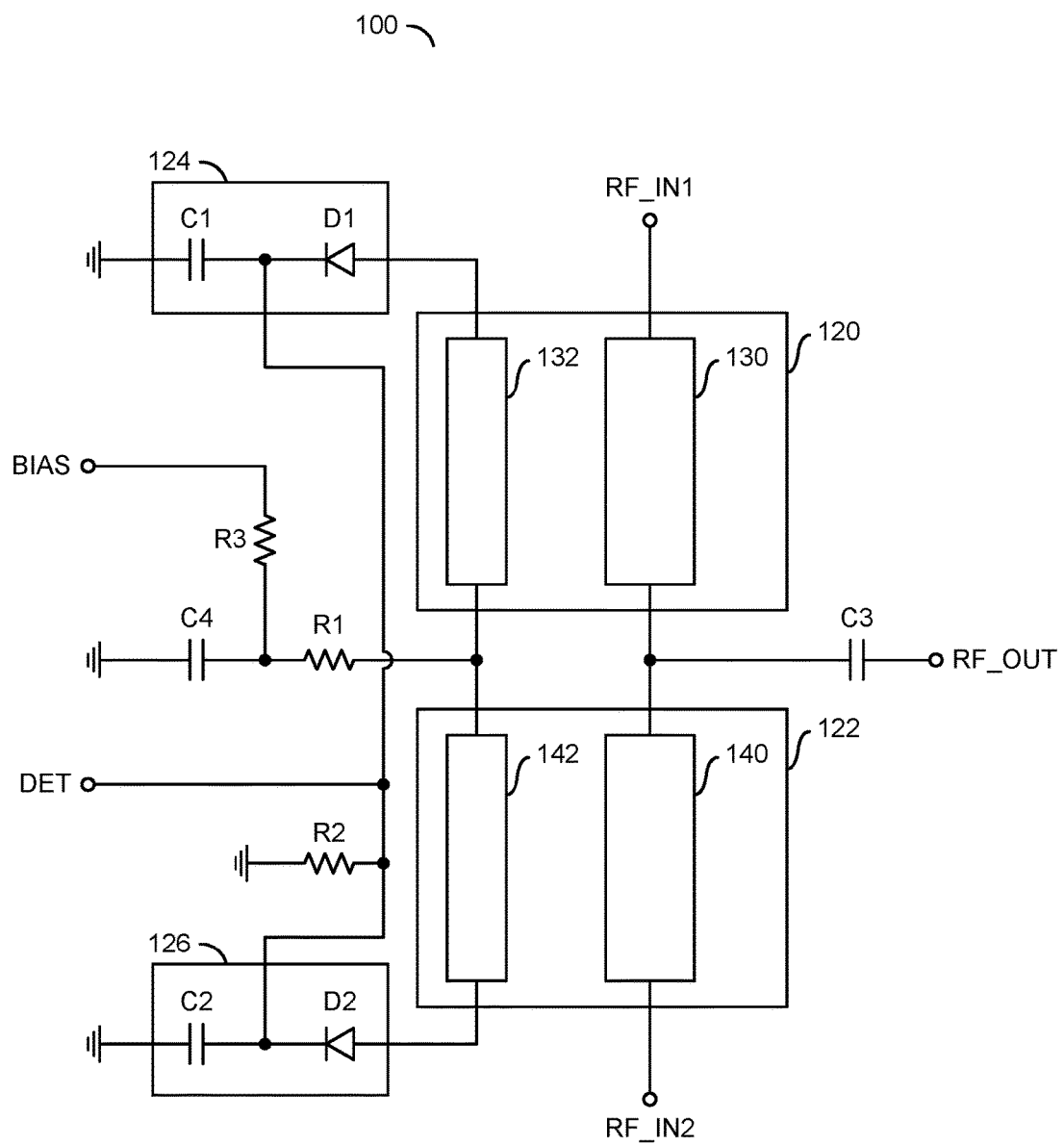
FIG. 2 is a simplified schematic diagram illustrating a power detector in accordance with an example embodiment of the invention.

Referring to FIG. 2, a schematic diagram is shown illustrating an example implementation of the circuit 100 in accordance with an example embodiment of the invention. In various embodiments, the circuit 100 implements a symmetrical detector structure utilizing a dual diode configuration. In an example, the circuit 100 provides a power detection system comprising a pair of directional couplers. Accurate power detection is accomplished by a pair of power detectors combining power detected at each of the directional couplers. In an example, the circuit 100 comprises a first directional coupler 120, a second directional coupler 122, a first detector 124, and a second detector 126. The directional couplers 120 and 122 may be implemented using quarter wavelength transmission lines. In an example, each of the directional couplers 120 and 122 may be implemented comprising a pair of microstrip lines or coplanar wave guide structures. The directional coupler 120 comprises a first (pass-through) transmission line 130 and a second (coupled) transmission line 132. The directional coupler 122 comprises a first (pass-through) transmission line 140 and a second (coupled) transmission line 142.

In an example, each of the detectors 124 and 126 comprise a diode (e.g., D1 and D2, respectively) and a capacitor (e.g., C1 and C2, respectively) connected in series. An input of each of the detectors 124 and 126 is connected to an anode of the diodes D1 and D2, respectively. An output of each of the detectors 124 and 126 is connected to a node formed by connections of a cathode of the diodes D1 and D2 and a first terminal of the capacitors C1 and C2, respectively. A second terminal of each of the capacitors C1 and C2 is connected to a circuit ground potential.

The first RF input signal RF_IN1 is presented to a first end of the pass-through transmission line 130. The second RF input signal RF_IN2 is presented to a first end of the pass-through transmission line 140. A second end of each of the pass-through transmission lines 130 and 140 are coupled together. In an example, the second ends of the pass-through transmission lines 130 and 140 are connected to a first terminal of a capacitor C3. The RF output signal RF_OUT is presented at a second terminal of the capacitor C3. A first (isolated) end of the transmission line 132 and a first (isolated) end of the transmission line 142 are coupled together. In one example, the first ends of the transmission lines 132 and 142 are connected to a first terminal of a resistor R1. A second (coupled) end of the transmission line 132 is connected to the input of the detector 124. A second (coupled) end of the transmission line 142 is connected to the input of the detector 126. The outputs of the detectors 124 and 126 are coupled together. In an example, the outputs of the detectors 124 and 126 are connected to a first terminal of a resistor R2. A second terminal of the resistor R2 is connected to the circuit ground potential.

In an example, the RF power detection signal DET, representing the combined power of the signals RF_IN1 and RF_IN2, is presented at a node formed by the connection of the outputs of the detectors 124 and 126 and the first terminal of the resistor R2. A second terminal of the resistor R1 connects to a first terminal of a resistor R3 and a first terminal of a capacitor C4. A second terminal of the capacitor C4 is connected to the circuit ground potential. A second terminal of the resistor R3 receives the bias input signal BIAS. In various embodiments, the signal BIAS provides an optimum voltage level for the diodes D1 and D2.

Figure 3:
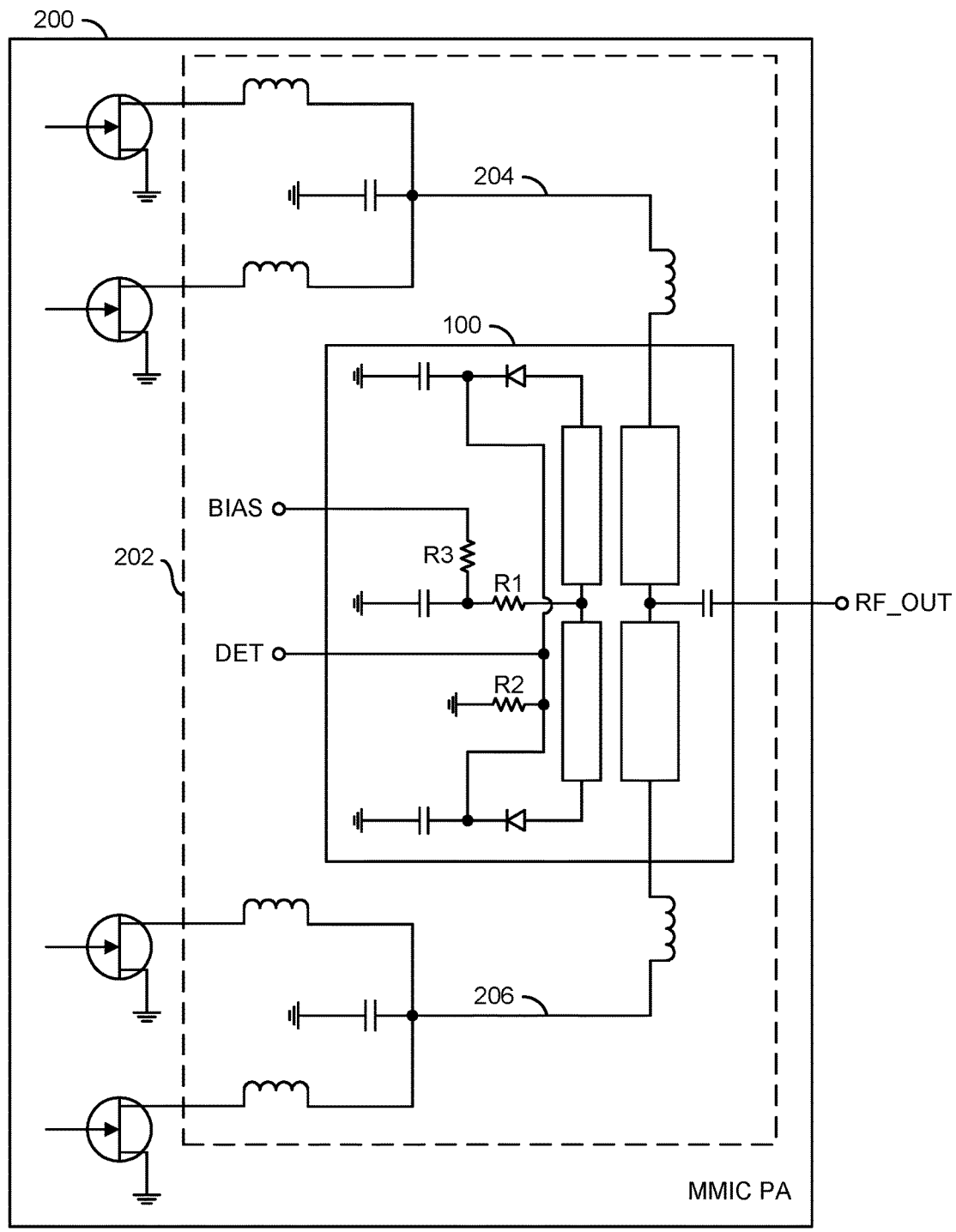
FIG. 3 is a schematic diagram illustrating a power amplifier with integrated power detector in accordance with an example embodiment of the invention.

Referring to FIG. 3, a schematic diagram is shown illustrating a monolithic microwave integrated circuit (MMIC) 200 comprising a power amplifier with an integrated power detector in accordance with an example embodiment of the invention. In various embodiments, the power detector 100 may be integrated with an output power combiner/impedance transformer 202 of the power amplifier MMIC 200 without sacrificing power amplifier performance. The integration of the power detector 100 within a footprint of the power amplifier generally avoids the MMIC die size being significantly increased.

In various embodiments, the design of the power detector 100 allows size reduction and integration with a high power amplifier (HPA) that has a single-ended topology on a monolithic microwave integrated circuit (MMIC). A HPA MMIC typically implements 4, 8, and even 16 way power combining. In various embodiments, the HPA MMIC includes a power combiner/impedance transformer 202 comprising a plurality of branch lines, arranged in a condensing tree structure, and culminating in two main branches 204 and 206. The power detector 100, implemented in accordance with an embodiment of the invention, allows for coupling symmetrically from the two main branch lines 204 and 206 of the output power combiner 202. The design enables the power detector 100 to be integrated within a footprint of the power combiner/impedance transformer 202. Since the power detector 100 may be integrated within the footprint of the combiner/transformer, addition of the power detector 100 does not increase circuit size and, consequently, does not incur an increase in die size and/or cost.

Figure 4:
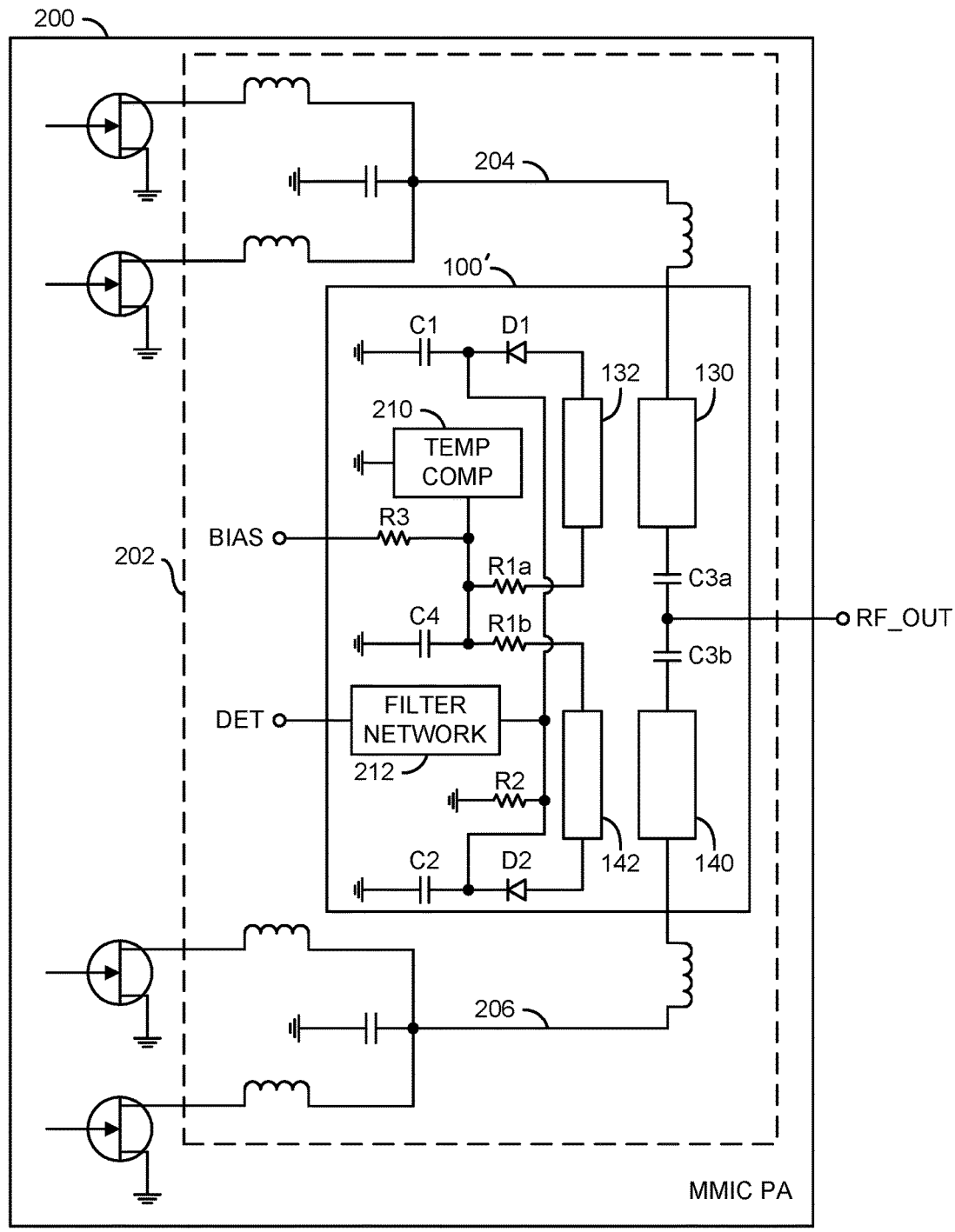
FIG. 4 is a schematic diagram illustrating a power amplifier with integrated power detector in accordance with another example embodiment of the invention.

Referring to FIG. 4, a schematic diagram is shown illustrating the MMIC 200 with an integrated power detector in accordance with another example embodiment of the invention. In some embodiments, a power detector 100' may be substituted for the power detector 100. The power detector 100' may be implemented similarly to the power detector 100, with the exception of the pass-through lines 130 and 140 being coupled to the RF output port via respective capacitors C3a and C3b, and the isolated ports of the coupled lines 132 and 142 being separately coupled to resistors R1a and R1b, respectively. In some embodiments, the power detector 100' may include a temperature compensation circuit 210 and/or a filter network 212.

In an example, the temperature compensation circuit 210 may be implemented as a pair of temperature compensation diodes connected in parallel between the circuit ground potential and a node formed at the connection of the capacitor C4 and the resistors R1a, R1b, and R3. The temperature compensation diodes may be configured to automatically adjust a biasing current over an operational temperature range of the MMIC 200. In various embodiments, the temperature compensation diodes may be implemented having a larger (e.g., 20X) gate periphery than the detector diodes D1 and D2. In an example, the detector diodes D1 and D2 and the temperature compensation diodes may be implemented with gate peripheries of 10 microns and 200 microns, respectively. The larger gate periphery of the temperature compensation diodes compensates biasing current over temperature, which makes diode detection voltage adjustment over temperature.

In an example, the resistors R1a and R1b may be implemented having a value of 50 ohms, the resistors R2 and R3 may be implemented having a value of 10K ohms, and the capacitors C1 and C2 may be implemented having a value of 1 picofarad (pF). In an example, the filter network 212 may be implemented as a 5K ohm resistor and a 1 pF shunting capacitor. In various embodiments, the filter network 212 may implement a voltage averaging circuit.

Figure 5:
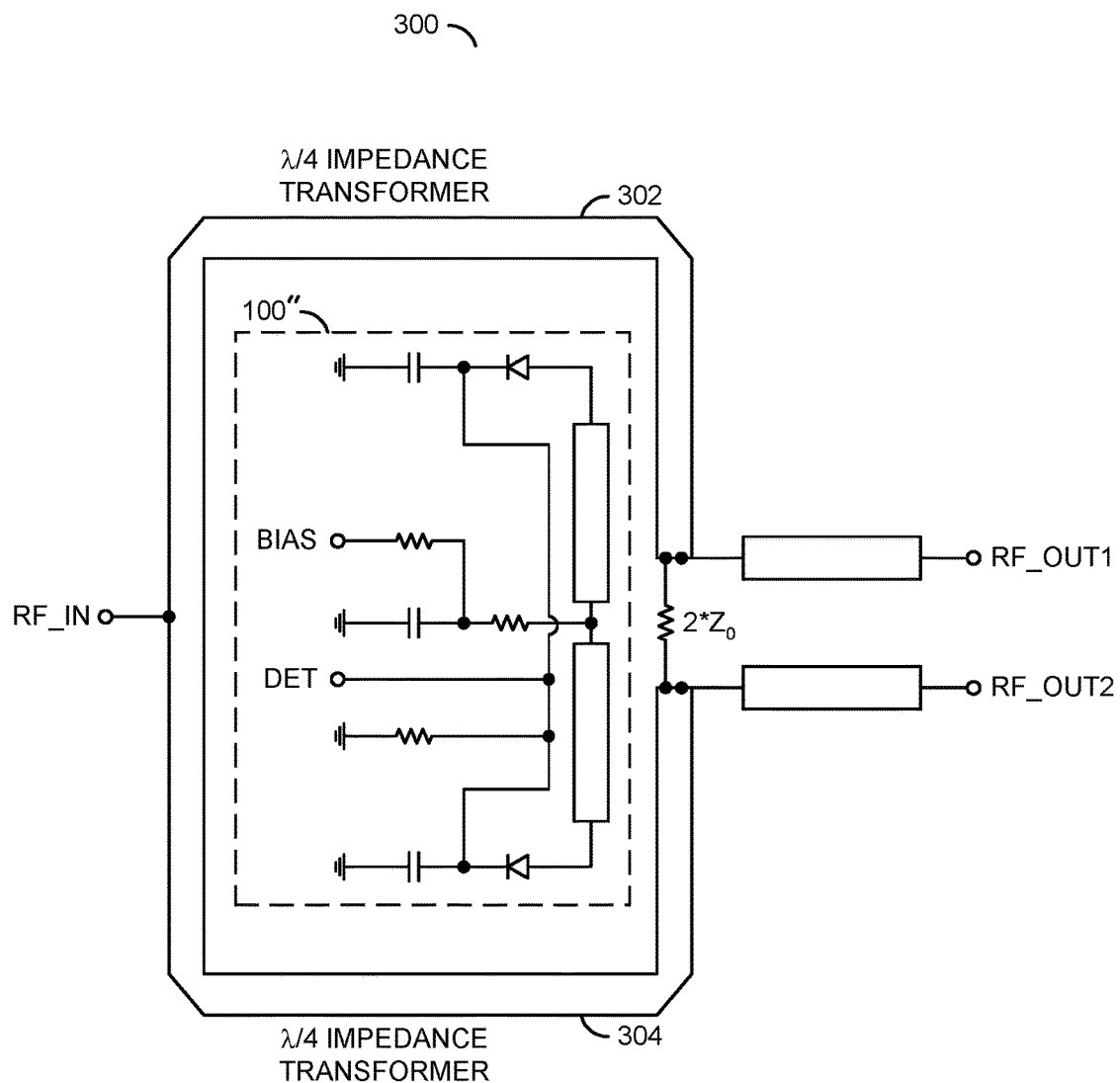
FIG. 5 is a schematic diagram illustrating a Wilkinson power divider with an integrated power detector in accordance with another example embodiment of the invention.

Referring to FIG. 5, a schematic diagram of a circuit 300 is shown illustrating a Wilkinson power divider/combiner design integrated with a power detector in accordance with another example embodiment of the invention. The technique(s) in accordance with embodiments of the invention are also applicable to Wilkinson power divider/combiner designs. The Wilkinson power divider/combiner is a three-port network that is lossless when the output ports are matched; where only reflected power is dissipated. The Wilkinson power divider/combiner can split input power into two or more in-phase signals with the same amplitude. For a two-way Wilkinson divider/combiner using $\lambda/4$ impedance transformers having a characteristic impedance of $\sqrt{2}\, Z_0$ and a lumped isolation resistor of $2*Z_0$ with all three ports matched, high isolation between the output ports may be obtained. The design of an equal-split (e.g., 3 dB) Wilkinson is often made in stripline or microstrip form.

The circuit 300 implements an equal-split design having two main branches 302 and 304. A circular split design may be used to reduce the size of the Wilkinson divider/combiner. In various embodiments, a circuit 100" provides power detection for the circuit 300. The circuit 100" may be implemented similarly to the circuit 100, except that portions of the two main branches 302 and 304 of the Wilkinson power divider/combiner 300 are used as the pass-through lines 130 and 140.

Figure 6:
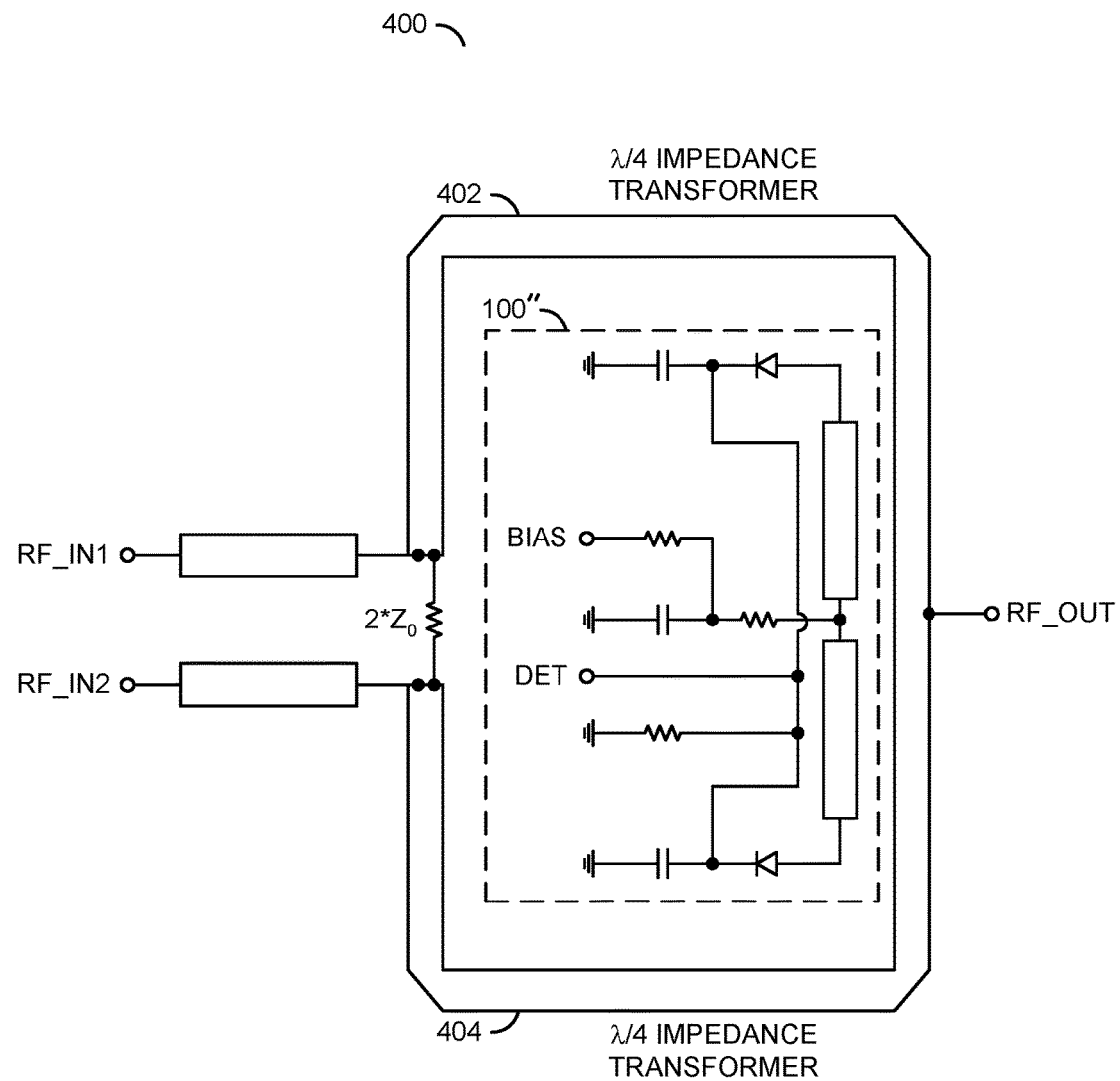
FIG. 6 is a schematic diagram illustrating a Wilkinson power combiner with an integrated power detector in accordance with another example embodiment of the invention.

Referring to FIG. 6, a schematic diagram of a circuit 400 is shown illustrating a Wilkinson power divider/combiner design integrated with a power detector in accordance with another example embodiment of the invention. The technique(s) in accordance with embodiments of the invention are also applicable to Wilkinson power divider/combiner designs. The Wilkinson power divider/combiner is a three-port network that is lossless when the input ports are matched; where only reflected power is dissipated. The Wilkinson power divider/combiner may be used to combine input power from two or more in-phase signals with the same amplitude into one output signal. For a two-way Wilkinson divider/combiner using $\lambda/4$ impedance transformers having a characteristic impedance of $\sqrt{2}\ Z_O$ and a lumped isolation resistor of $2*Z_O$ with all three ports matched, high isolation between the input ports may be obtained. The design of an equal-split (e.g., 3 dB) Wilkinson is often made in stripline or microstrip form.

The circuit 400 implements an equal-split design having two main branches 402 and 404. A circular split design may be used to reduce the size of the Wilkinson divider/combiner. In various embodiments, portions of the two main branches 402 and 404 of the Wilkinson power divider/combiner are used as the pass-through lines 130 and 140, and the circuit 100" is located adjacent to the junction between the two main branches 402 and 404 and the output port of the Wilkinson power divider/combiner.

Figure 7:
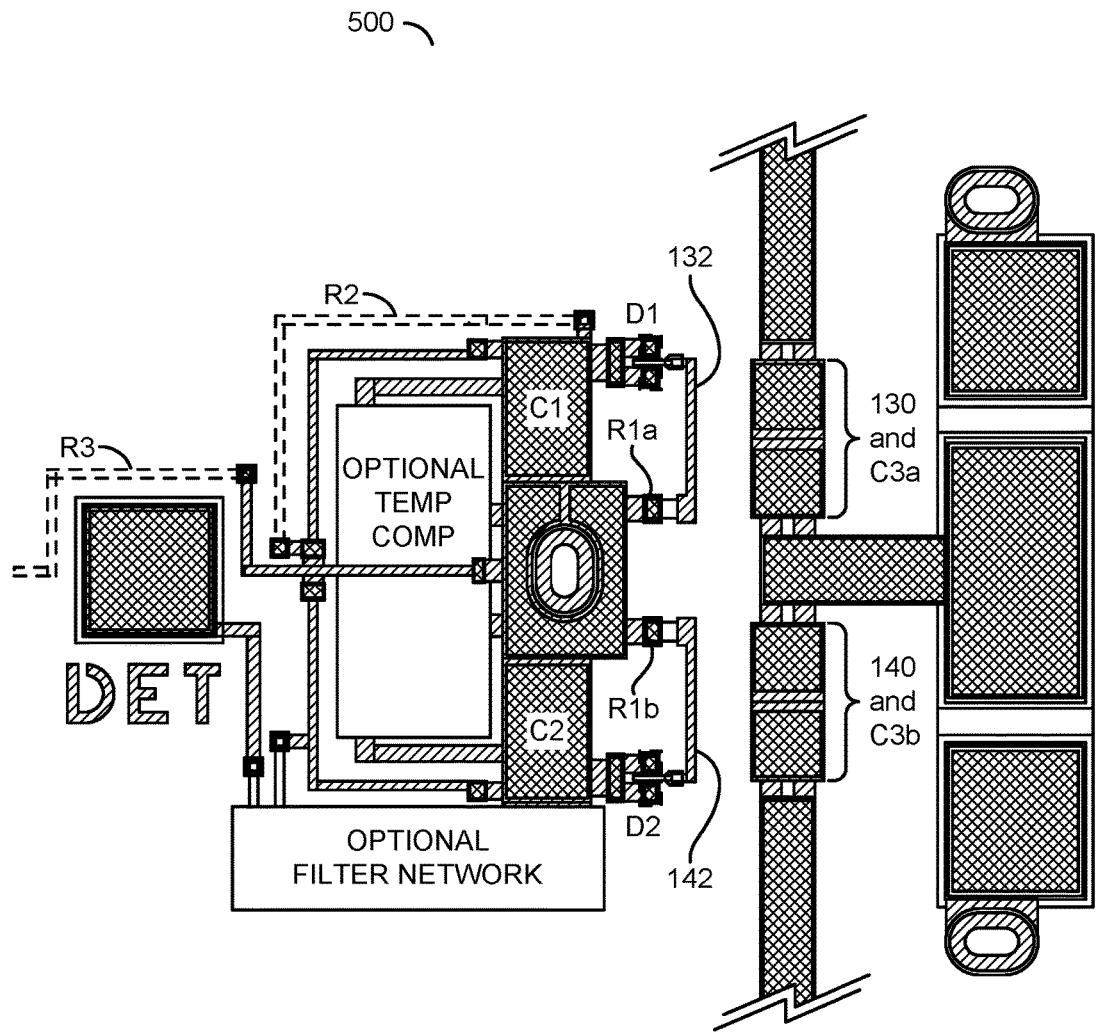
FIG. 7 is a diagram illustrating an example circuit layout of a power detector in accordance with an example embodiment of the invention.

Referring to FIG. 7, a diagram is shown illustrating an example circuit layout 500 implementing the power detector 100' of FIG. 4. In an example, the pass-through lines 130 and 140 may be implemented with microstrip lines having dimensions of 41×91 microns and the coupled lines 132 and 142 may be implemented with microstrip lines having dimensions of 5×94 microns. The coupled lines 132 and 142 are placed adjacent to the pass-through lines 130 and 140, such that a gap of approximately 20 microns is formed between the pass-through lines 130 and 140 and the coupled lines 132 and 142, respectively. However, other dimensions may be implemented to meet design criteria of a particular implementation.

In some embodiments, the circuit layout 500 may also incorporate a temperature compensation circuit and/or a filter network as described above (e.g., in connection with FIG. 4). The circuit 500 generally provides a dual diode RF power detector that is compact enough to fit within a space between two main branches of a power combiner/impedance transformer of a MMIC power amplifier.

The functions and structures illustrated in the diagrams of FIGS. 1 to 7 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a first directional coupler;
   a second directional coupler;
   a first detector; and
   a second detector, wherein
   (i) an input port of the first directional coupler is configured to receive a first input signal,
   (ii) an input port of the second directional coupler is configured to receive a second input signal,
   (iii) a through port of the first directional coupler is coupled to a through port of the second directional coupler forming a node at which an output signal is presented in response to the first and the second input signals,
   (iv) a bias input is formed at a node formed by connection of an isolated port of the first directional coupler to an isolated port of the second directional coupler, wherein the bias input is configured to set a bias level of the first detector and the second detector in response to a bias input signal,
   (v) a coupled port of the first directional coupler is coupled to the first detector,
   (vi) a coupled port of the second directional coupler is coupled to the second detector, and
   (vii) a detected power signal is generated by combining an output of the first detector and an output of the second detector.

2. The apparatus according to claim 1, wherein the first directional coupler and the second directional coupler each comprises a pair of parallel microstrip lines.

3. The apparatus according to claim 1, wherein the first directional coupler and the second directional coupler each comprises a pair coplanar wave guide structures.

4. The apparatus according to claim 1, wherein the first directional coupler and the second directional coupler are integrated within a power amplifier integrated circuit.

5. The apparatus according to claim 1, wherein the first directional coupler and the second directional coupler are integrated within a power amplifier on a monolithic microwave integrated circuit.

6. The apparatus according to claim 5, wherein the first directional coupler and the second directional coupler are integrated within an output power combiner of the power amplifier.

7. The apparatus according to claim 6, wherein the first directional coupler and the second directional coupler symmetrically couple two main branch lines of the output power combiner.

8. The apparatus according to claim 7, wherein the output power combiner comprises a Wilkinson divider/combiner.

9. The apparatus according to claim 5, wherein the first directional coupler and the second directional coupler are integrated within an impedance transformer of the power amplifier.

10. The apparatus according to claim 9, wherein the first directional coupler and the second directional coupler symmetrically couple two main branch lines of the impedance transformer.

11. The apparatus according to claim 1, wherein each of the first detector and the second detector comprises a diode coupled to a circuit ground potential by a capacitor.

12. The apparatus according to claim 1, wherein the bias input is configured to set the bias level for generation of the detected power signal.

13. The apparatus according to claim 12, wherein the bias level is temperature compensated.

14. The apparatus according to claim 12, further comprising a filter network configured to filter the detected power signal.

15. A method to detect power comprising:
    measuring power at a port associated with a first directional coupler;
    measuring power at a port associated with a second directional coupler,
    wherein (i) a through path of the first directional coupler is connected in series with a through path of the second directional coupler by a first node forming an output port and (ii) an isolated port of the first directional coupler and an isolated port of the second directional coupler are coupled together by a second node configured to set a bias level of the first and the second directional couplers in response to a bias input signal; and
    detecting total power by combining power detected at a coupled port of the first directional coupler and power detected at a coupled port of the second directional coupler.

16. The method according to claim 15, wherein the first directional coupler and the second directional coupler are implemented in connection with a monolithic microwave integrated circuit power amplifier.

17. The method according to claim 16, wherein the first directional coupler and the second directional coupler are integrated within an output power combiner of the monolithic microwave integrated circuit power amplifier.

18. The method according to claim 16, wherein the first directional coupler and the second directional coupler are integrated within an impedance transformer of the monolithic microwave integrated circuit power amplifier.

19. The method according to claim 16, wherein integration of the first directional coupler and the second directional coupler within the monolithic microwave integrated circuit power amplifier does not significantly increase a die size of the monolithic microwave integrated circuit power amplifier.

20. The method according to claim 15, further comprising:
    biasing the first and the second directional couplers using a temperature compensated bias signal; and
    generating a detected power signal representing the total power using a filter network.

* * * * *